United States Patent [19]

Omori et al.

[11] Patent Number: 5,087,959
[45] Date of Patent: * Feb. 11, 1992

[54] PROTECTIVE COATING USEFUL AS A PASSIVATION LAYER FOR SEMICONDUCTOR DEVICES

[75] Inventors: Masahiro Omori, Palo Alto; Edward B. Stoneham, Los Altos, both of Calif.

[73] Assignee: Microwave Technology, Inc., Fremont, Calif.

[*] Notice: The portion of the term of this patent subsequent to Nov. 20, 2007 has been disclaimed.

[21] Appl. No.: 162,912

[22] Filed: Mar. 2, 1988

Related U.S. Application Data

[63] Continuation-in-part of Ser. No. 20,920, Mar. 2, 1987, Pat. No. 4,972,250.

[51] Int. Cl.$^5$ .................. H01L 21/94; H01L 21/469; H01L 21/441
[52] U.S. Cl. ........................ 357/54; 357/52; 357/2; 357/67
[58] Field of Search .............. 357/4, 2, 67, 52, 59, 357/54; 437/196

[56] References Cited

U.S. PATENT DOCUMENTS

| | | | |
|---|---|---|---|
| 3,630,678 | 12/1971 | Gardner | 23/209.1 |
| 3,661,526 | 5/1972 | Angus et al. | 23/209.1 |
| 4,028,149 | 6/1977 | Deines et al. | 148/175 |
| 4,254,426 | 3/1981 | Pankove | 357/2 |
| 4,420,765 | 12/1983 | Tarng | 357/52 |
| 4,436,766 | 3/1984 | Williams | 427/96 |
| 4,722,912 | 2/1988 | Miller | 357/6 |
| 4,767,608 | 8/1988 | Matsumoto et al. | 423/446 |

FOREIGN PATENT DOCUMENTS

| | | |
|---|---|---|
| 0185787 | 12/1984 | European Pat. Off. . |
| 2944937 | 6/1981 | Fed. Rep. of Germany . |
| 58-145134 | 2/1982 | Japan . |
| 60-208852 | 10/1985 | Japan . |
| 61-6198 | 1/1986 | Japan . |

OTHER PUBLICATIONS

Kapoor, et al., "Diamondlike Carbon Films on Semiconductors for Insulated-Gate Technology", American Vacuum Society, J. Vac. Sci. Technol. A, vol. 4, No. 3, 3/1986.
Has, Z. et al., "Electrical Properties of Thin Carbon Films Obtained by R.F. Methane Decomposition on an R.F. Powered Negatively Self-Biased Electrode", *Thin Solid Films*, 136, pp. 161–166, Feb. 15, 1986.
"Advanced Materials", *Fortune*, pp. 34–36, Oct. 13, 1986.
"Diamond Process Improved", *Electronic Engineering Times*, p. 24, Oct. 26, 1987.
Brown, Alan S., "Diamonds Shine Brightly in Aerospace's Future", *Aerospace America*, pp. 12–15 and 37, Nov. 1987.
Graff, Gordon, "Diamonds Find New Settings", *High Technology*, pp. 44–47, Apr. 1987.
Browne, Malcolm W., "New Era of Technology Seen in Diamond-Coating Process", *The New York Times*, p. 1, Sep. 14, 1986.
Robinson, Arthur, "Is Diamond the New Wonder Material?", *Science*, vol. 234, pp. 1074–1076, Nov. 1986.
Sloan Model S-310 RF/DC Sputter Gun, Installation and Operating Instructions, Aug., 1976, M-632(a)-876.
Stambler, Irwin, "U.S. Plays Catch-up in Diamond Thin-Film Technology", *Research & Development*, pp. 41–42, Aug. 1987.

(List continued on text page.)

Primary Examiner—William Mintel
Assistant Examiner—S. V. Clark
Attorney, Agent, or Firm—Skjerven, Morrill, MacPherson, Franklin & Friel

[57] ABSTRACT

A protective coating useful as a passivation layer for semiconductor devices incorporates a thin film of an amorphous diamond-like carbon. In one implementation, a thin film of amorphous silicon is deposited over the carbon material. The semiconductive passivation coating prevents electrical shorts, dissipates charge build-up and protects against chemical contamination.

21 Claims, 4 Drawing Sheets

OTHER PUBLICATIONS

Miller, James P., "Firms Rush to Commercialize Multifaceted Diamond Films", *Wall Street Journal*, Oct. 7, 1987.

Juillard, Marie Jeanne, "Big Profits in Theory—Can Crystallume Make Diamonds Sutter Hill's Best Friend?", *Venture*, pp. 80 and 82, Dec. 1986.

"Research Proposal on Diamond and Diamondlike Carbon Coatings", Battelle, Oct. 1986.

Wilson, John W., "The Key to Making More Powerful Chips", *Business Week, Science & Technology*, pp. 136F-136G, May 11, 1987.

"Depositing Synthetic Diamond on a Thin Film", *Chemical Week*, p. 69, May 7, 1986.

"Diamond-Hard Coatings", *Industry Week*, p. 83, Nov. 16, 1987.

Berg S. et al., "Diamond-Like Carbon Films Produced in a Butane Plasma", *Thin Solid Films*, vol. 58, 1979, pp. 117-120.

Williams, Ralph E., "Gallium Arsenide Processing Techniques", Artech House, Inc., Deedham, Mass., pp. 17, 32-33, 1984.

Sze S. M., *Physics of Semiconductor Devices*, John Wiley & Sons, N.Y., Table on pp. 848-849.

Callaghan, M. P., et al., "A New System for the Chemical Vapour Deposition of SiC", *Journal of Crystal Growth*, 13/14, pp. 397-401, May 1972.

Szmidt et al., "Basic Properties of Metal/Insulator/Semiconductor Structures Containing Borazone and Diamond Layers Produced by the Reactive Pulse Plasma Method", *Thin Solid Films*, 110, pp. 7-20, 1983.

FIG. 3
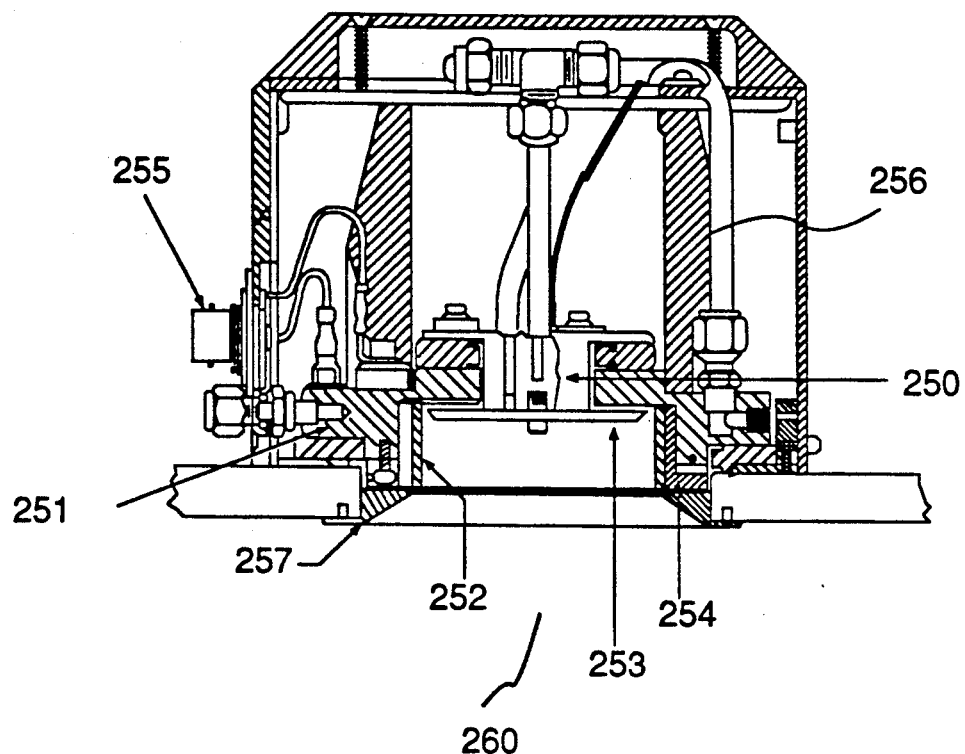
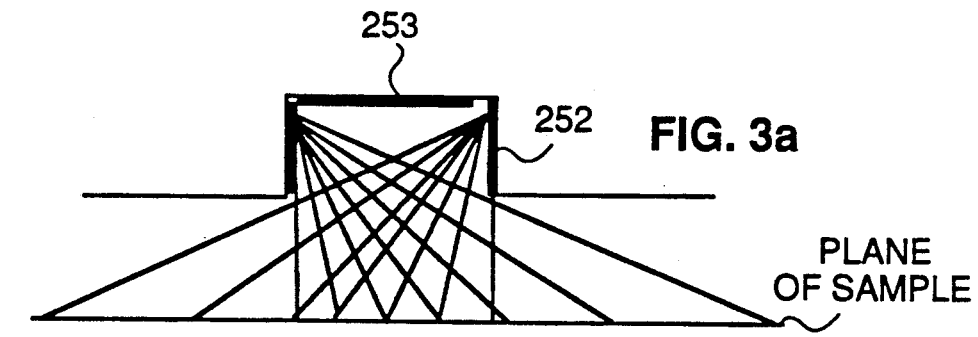
FIG. 3a
PLANE OF SAMPLE
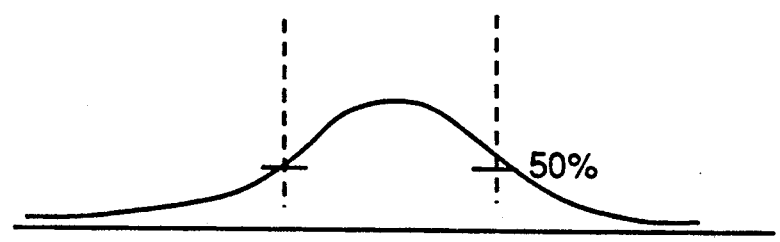
50%
FIG. 4

PROTECTIVE COATING USEFUL AS A PASSIVATION LAYER FOR SEMICONDUCTOR DEVICES

CROSS-REFERENCE TO RELATED APPLICATIONS

This application is a continuation-in-part of our U.S. Pat. application Ser. No. 07/020,920 filed on Mar. 2, 1987 and entitled "Protective Coating Useful As A Passivation Layer For Semiconductor Devices," now U.S. Pat. No. 4,972,250.

BACKGROUND OF THE INVENTION

1. Field of the Invention

This invention relates generally to a protective coating for electrical devices and in particular to a thin film useful as a passivating coating for a semiconductor device.

2. Description of the Prior Art

In present day semiconductor technology, passivation layers are used to protect semiconductor device structures against environmental influences that arise in the manufacture and use of semiconductor devices. Passivation layers protect the semiconductor devices from the effects of moisture and contaminants during the manufacturing process and thereafter, or during the operation of the devices in circuit environments. By using passivation layers, production yield is increased and deleterious effects are minimized when the semiconductor device is operating in the field.

Especially desirable are passivation layers that effectively passivate surface states, which are electron energy levels at the surface of the semiconductor substrate, characterized by electrical charge and discharge having variable time constants. This phenomenon causes short term and long term electrical drift, which undesirably changes the characteristics of a field effect transistor, and other phenomena such as light sensitivity and noise generation. Surface states are "passivated" when a layer of material (typically but not necessarily an insulating material) overlying the semiconductor surface interacts with atoms at the surface in such a way as to reduce the time constants characterizing the electrical charge and discharge of the surface states to values small enough to eliminate electrical drift problems. Surface states on a silicon crystal can be passivated by a silicon dioxide layer produced by thermal oxidation, for example. Surface states on gallium arsenide can be passivated by a layer of semiconducting material other than gallium arsenide, for example, provided the interface between the gallium arsenide surface and the semiconducting material is appropriately controlled. The resulting junction between the semiconductor surface and the layer of semiconducting material is called a "heterojunction".

Passivation layers often insulate and protect the semiconductor surface against electrical shorting and low breakdown voltages. Passivation layers also act as potting materials that protect against surface scratches and thus prevent electrical shorting.

Some semiconductor device handling processes use vacuum wands or other tools to move wafers or chips from one position to another. In such cases, the tool may move or abrade exposed metal conductors that are formed on the wafers. Passivation layers help eliminate this problem. Another problem is encountered with semiconductor devices that incorporate an air bridge, which is a metal connection to a metal conductor that skips over an adjacent conductor, so that significant capacitive coupling is not added between the two conductors. The air between the air bridge and the skipped-over conductor has a low dielectric constant of nearly unity. However, if the metal air bridge is subjected to mechanical pressure causing it to contact the skipped-over metal conductor, an electrical short would result. A passivation layer overlying the skipped-over metal conductor can act as an electrical insulator to insure against such shorting.

Passivation layers generally are composed of silicon dioxide or silicon nitride, for example. Passivation layers using such materials are usually relatively thick, about 2000 Å or more, and require long deposition time, which adds to the cost of the semiconductor devices. With dielectric constants more than three times that of air these thick layers increase the capacitances between various parts of a semiconductor device, thereby degrading the device's high-frequency performance. Also, silicon dioxide and silicon nitride do not adhere very well to gold which is used for electrodes or conductors and actually are known to separate from gold conductors so that circuit problems are caused. Thick layers of insulators or passivation material using silicon dioxide or silicon nitride are subject to strain, and as they are relatively brittle in nature, can experience cracking and do not seal well. Furthermore, insulators such as silicon dioxide or silicon nitride do little to passivate surface states on some semiconductors, such as gallium arsenide, and can themselves act as charge traps and produce drift problems.

In the Japanese Patent Application No. 58-145134 filed Feb. 23, 1982 by Toshiaki Ogata, diamond films formed by thermal decomposition of hydrocarbon gases in a depressurized atmosphere or by plasma formation are used as the insulating films between polycrystalline silicon wiring and aluminum wiring. Diamond films formed by the same method are also used in passivation layers above the aluminum wiring. The diamond films in the passivation layers are reported to improve heat dissipation and also improve mechanical strength. The term "passivation" here is not used in the context of a layer overlying the semiconductor surface which interacts with atoms of the surface in such a way as to effectively passivate the surface states of the semiconductor substrate.

Ogata does not describe the thermal decomposition process or the plasma formation process, however, a typical thermal chemical vapor deposition (CVD) apparatus used to deposit continuous films of diamond at rates up to 10 micrometers per hour, is shown in FIG. 1 of this application. In this CVD procedure, a deposition chamber 110 includes a tungsten filament 100 that is heated to 2000° C. to dissociate gaseous hydrogen supplied through pipe 101 that is disposed above a substrate 103, which may be of a silicon, silica, or molybdenum material. The substrate 103 rests on a molybdenum cover 104 which in turn is supported by a substrate holder 105. A mixture of methane and gaseous hydrogen is supplied through pipe 101 so that both the methane and the hydrogen flow over the tungsten filament 100 before reaching substrate 103. The deposition chamber 110 is surrounded by a silica tube 106 that is attached to furnace 107.

In the thermal CVD process using hydrogen and methane, the carbon atoms from the pyrolyzed methane are deposited upon the heated substrate 103 where they build up as polycrystalline diamond deposits. In another prior art thermal CVD process, the gaseous hydrocarbon, such as methane, is replaced by methanol, ethanol, acetone or some other oxygen-and/or nitrogen-containing carbon compounds. It has been observed that the diamond deposition rate for this prior art thermal CVD process was at least ten times that of the methane based techniques, indicating that these other compounds are more efficient than the methane. With acetone, the polycrystalline films grew at a rate of 10 micrometers per hour.

A typical plasma formation apparatus for creating a diamond-like film on transparent slides of silicon or silica is shown in FIG. 2. A mixture of hydrogen and methane enters through the gas inlet 200 into a fused quartz tube 205. The quartz tube 205, which serves as the deposition chamber, is evacuated by a pump 206. As the hydrogen-methane mixture progresses through the tube 205, the mixture is passed through a microwave discharge 201 that dissociates the gas molecules to form an electrically charged plasma 204. The plasma 204 comes into contact with a sample 202 to be coated, which is supported by a stand 203 within tube 205. Single atoms of carbon bombard the surface of sample 202 and gradually the carbon atoms on the surface link together into diamond crystal lattice structures.

In each of the above methods the important aspect of the process is the dissociation of the hydrogen molecules into unstable atomic hydrogen. The presence of atomic hydrogen is believed to prevent double bonds from forming between carbon atoms until the carbon atoms are ready to join together in the single bonded configurations required for diamond crystals.

In both of the above prior art methods for forming a diamond-like film, the hydrogen and carbon are pumped into the deposition chamber as gases and are dissociated by the process within the chamber. The silicon substrate is subjected to high temperatures and high energy particle bombardment. If a compound semiconductor, such as GaAs, is used, the high energy hydrogen atoms penetrate the compound semiconductor substrate which causes a reduction of carrier concentration near the surface due to compensation. Accordingly, the prior art methods of depositing a thin diamond layer on a substrate are not suitable for use with compound semiconductor substrates such as GaAs. A novel and improved method, which is suitable for deposition of a thin diamond layer on semiconductor surfaces of a substrate wherein the substrate is not exposed to high energy particles, is disclosed below.

SUMMARY OF THE INVENTION

An object of this invention is to provide a novel coating that is effective to protect electrical devices from electrical shorting and failure.

Another object of this invention is to provide passivation material for a semiconductor device that realizes an improvement in production and handling yields and enhances performance and reliability of the operating device.

Another object of this invention is to provide a semiconducting passivation material for a semiconductor device that partially passivates surface states and reduces drift problems in the operating device.

In accordance with this invention, a protective coating useful for a semiconductor device is formed with a carbon material that has diamond-like characteristics and is semiconducting. To obtain the desired carbon coating, a ring of graphite material is used as a target in a sputtering system to deposit a thin film of carbon to a specified thickness. The passivation layer covers portions of the substrate, electrodes and metal conductors that are exposed.

In one embodiment of this invention, a very thin film of amorphous silicon is deposited over the carbon layer. The silicon thin film protects the carbon from removal during plasma cleaning that occurs during the semiconductor manufacturing process and provides additional sealing and protection. In another implementation, wherein an air bridge connection to conductive elements on the substrate is formed, the passivation layer serves to insulate the conductive air bridge from adjacent exposed conductors where an electrical shorting problem could exist.

In yet another embodiment, hydrogen gas and argon gas are used in the carbon sputtering system at a low temperature to obtain as good a quality diamond-like layer on compound semiconductor substrates as is obtainable with the prior art thermal chemical vapor deposition methods using hydrogen gas. In this method the substrate, having its surface first cleaned using a plasma cleaning technique, is placed in a sputtering system wherein hydrogen gas is introduced at a controlled rate, together with the argon gas which is normally used in the system. A hard diamond-like film is produced on the compound semiconductor surface without exposing the compound semiconductor substrate to the detrimental effects of high energy hydrogen bombardment or high temperatures. The diamond-like film formed by this method has superior clarity, resistivity and reflection properties relative to diamond-like films formed by sputtering without the addition of hydrogen.

DESCRIPTION OF THE DRAWING

The invention will be described in greater detail with reference to the following drawings.

FIG. 3 is a cross-sectional view of the sputtering gun used in the present invention.

FIG. 3a illustrates the particle impact paths for deposition on the surface of a body when subjected to sputtering deposition in accordance with the present invention.

FIG. 4 illustrates the distribution of sputtered particles from the gun of FIG. 3.

Figure 1:
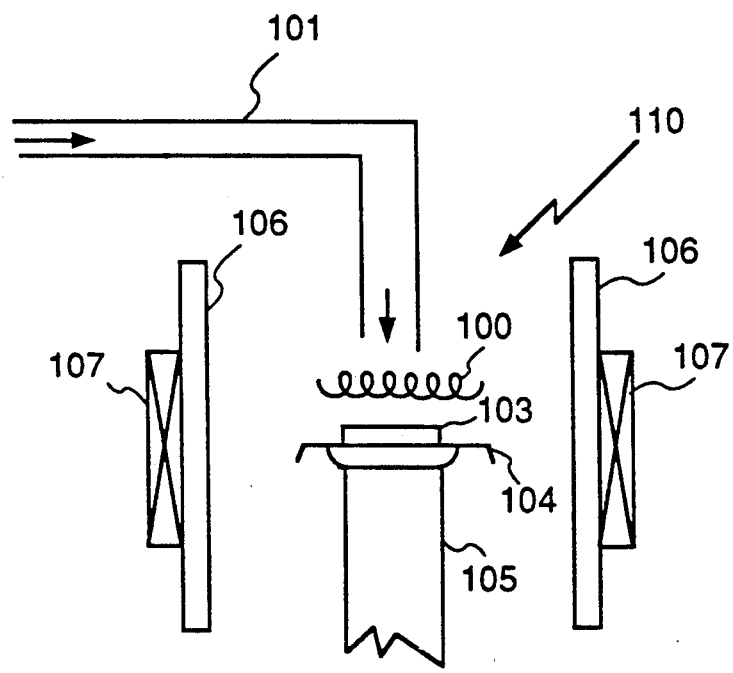
FIG. 1 is a schematic diagram of a prior art thermal chemical vapor deposition apparatus for growing diamond-like films.
Figure 2:
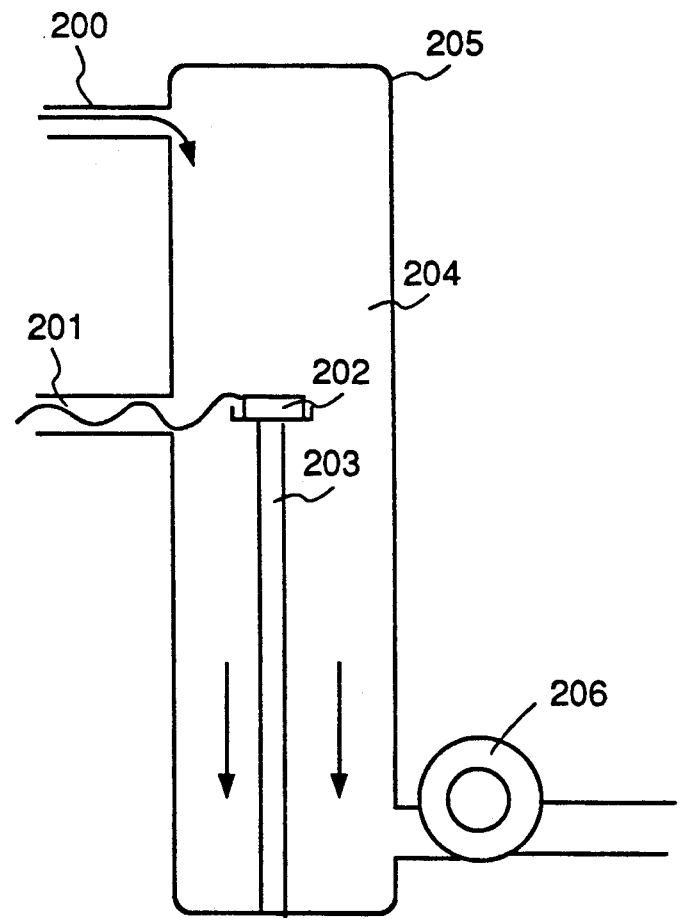
FIG. 2 is an illustration of a prior art plasma deposition apparatus for growing diamond-like films.

The drawings depict elements that are not in proper proportion or to scale, but are presented for the purpose of clarity and explanation.

DETAILED DESCRIPTION OF THE INVENTION

Although the description is directed to the use of a passivation material for a semiconductor device, it should be understood that the protective coating disclosed herein is also applicable to other electrical assemblies such as thin film circuits, microwave monolithic integrated circuits, optical devices, optoelectronic devices, and for use as capacitor dielectrics, by way of example.

To apply the diamond-like carbon layer to a compound semiconductor substrate, the substrate is first cleaned, by etching for example. In one embodiment, a standard plasma dry etch process is used to clean the semiconductor substrate. In this process, the substrate is cleaned by ashing the substrate at fifty watts RF power with oxygen in the chamber at 1 Torr pressure in a Tegal Model 200 asher, for five minutes.

Plasma cleaning can also be achieved with a "dry processing system" IDPS). The DPS is a vacuum system with the configuration of a planar reactive ion etching system. It has a circular aluminum cathode 10.4 inches in diameter with a 1.38-inch diameter hole in the middle acting as a pump port. The spacing of the grounded anode from the cathode is 2.5 inches. The cathode is driven by a 13.56 MHz radio frequency (RF) generator matched to achieve minimum reflected power. For cleaning of a wafer prior to deposition of the passivation layer, oxygen is introduced into the DPS chamber at a flow rate of 120 sccm and a pressure of 700 microns. Then, 25 watts of RF power are applied for a period of five minutes while the cathode is maintained at room temperature. When the cleaning is completed, the wafer is removed from the DPS system and placed in another system for deposition of the passivation layer.

After the substrate is cleaned using the plasma dry etch process, the substrate is positioned in a vacuum chamber fitted with a Sloan Model S-310 sputter gun, a cross-section of which is illustrated in FIG. 3. The sputter gun includes anode assembly 250 which is mounted perpendicular to cathode assembly 251. Cathode 252, which is the sputtering target, is held by a target holder 254 and precisely positioned, as described in the instruction manual for the Sloan Model S-310 sputter gun, so that cathode 252 is a specified distance from the anode 253. Cathode 252 is a graphite ring which is approximately one-eighth inch thick and comprised of 99.999+% carbon. Magnet 256 is mounted directly above cathode assembly 251 and anode assembly 250. The cleaned substrate is placed in the deposition chamber 260 of the sputter gun so that its surface is at a specified working distance of about 1.7 inches from the lower edge of anode 252.

After the cleaned substrate is placed in the working volume of the sputter gun as described above, the sputter gun is sealed and chamber 260 is pumped down to a pressure of $1 \times 10^{-7}$ Torr Chamber 260 is held at this pressure for approximately ten minutes so that any residual oxygen or water vapor is removed from the chamber. Chamber 260 is then back-filled with argon gas. The pressure of the argon gas, measured at the gas injection port of the sputter gun, was in the range of 5-25 millitorr, and preferably about 8.5 millitorr. The other pressures specified in this application hereinafter were also as measured at the gas connection port to the sputter gun and were measured with a Convectron Gauge Model No. 275 manufactured by Granville-Phillips. The volume of chamber 260 was approximately seventeen liters.

A high voltage, supplied through the high voltage cable connector 255, is applied across cathode 252 and anode 253. The operating voltage and current level of the sputter gun are selected in accordance with the chamber 260 pressure, the gas atmosphere and the target material. When using the above-noted argon pressure of about 8.5 millitorr and an applied voltage required to sustain a current of about 0.2 amps DC, the sputter gun provides a deposition rate of the carbon onto the substrate of about 50 Å per minute or 0.3 micrometers per hour. Because the sputtering source, cathode 252, is physically and electrically separate from the substrate, high power densities can be employed without excessively heating the substrate.

Since the hollow cathode 252 is energized in an atmosphere of argon, the resulting electrostatic field works in conjunction with the magnetic field from permanent magnet 256 to constrain emitted electrons to a tight, spiral pattern near the surface of cathode 252. The electrons are forced to travel a comparatively long path and the probability of an ionizing collision with an argon atom in the vicinity of cathode 252 is high. When an argon atom is ionized, it is attracted to cathode 252 with sufficient force to dislodge an atom of the carbon material comprising cathode 252. These sputtered carbon atoms are ejected from cathode 252 in random directions and enter the deposition cavity 260 in a pattern that encompasses virtually all angles of impact on the substrate. FIG. 3a illustrates the particle path of the carbon particles ejected from cathode 252. The distribution of sputtered material follows the pattern shown in FIG. 4.

The substrate is not a part of the sputtering source electrical circuit. Since secondary electrons from cathode 252 are trapped by the magnetic field, electron bombardment of the substrate is minimal in comparison either to sputtering systems in which the substrate holder serves as the anode, or to the prior art systems for depositing carbon on a substrate. The sputtering process also avoids significant substrate heating and does not subject the substrate to bombardment by high energy ionized particles, such as ionized hydrogen atoms.

Thus, while high deposition rates can be obtained, there is only a negligible heating effect on the substrate. The deposited carbon is much harder than graphite and has diamond-like carbon characteristics. Also, the deposited carbon adheres well to the exposed areas of the substrate and to any metallization which is deposited on the substrate.

In a preferred embodiment, the substrate was prepared and placed in the deposition chamber of the sputter gun as described above. The sputtering process was repeated using, instead of pure argon, a mixture of argon and 5% to 60% hydrogen-introduced to the deposition chamber and sputter gun. The pressure of the argon gas was maintained at about 8.5 millitorr as in the above example where argon alone was used. The pressure of the hydrogen gas, as measured at the gas connection port to the sputter gun with the above identified gauge, was approximately 4 millitorr. When using the argon/hydrogen mixture, the distance from the substrate to the lower edge of anode 253 in this embodiment was approximately four inches. Of course other distances are usable. The operation of the sputter gun depends upon the target material, the gas used, the voltage and current. When a hydrogen-argon gas mixture is used with the carbon target, a DC current of about 0.6 amps is used to obtain a deposition rate of about 50 Å/minute. The hydrogen content could be raised up to 100%. It will of course also be appreciated that the source of hydrogen could be substances such as methane, methanol, acetylene, acetone, ethane and ammonia.

As previously described, the electrostatic fields and the magnetic fields of the sputter gun prevent high energy ionized hydrogen from impacting the substrate. Hence, unlike the prior art where the substrate was placed directly in a plasma or in a high temperature field which generated high energy ionized hydrogen, the sputtering process of this invention causes less or no degradation to a compound semiconductor substrate such as GaAs because the substrate is not subjected to high energy ionized particles.

To demonstrate the advantage of the hydrogen-argon sputtering process over the prior art processes, the performance of a GaAs field-effect transistor (FET) which was not processed in accordance with the present invention was first measured. The FET was then coated with approximately 150 Å of the diamond-like material using the argon-hydrogen gas mixture sputtering process and the performance of the FET was again measured. There was no measurable difference in the operating performance of the FET before application of the diamond coating and the operating performance of the FET after application of the diamond coating. Thus unlike prior art processes which degrade the performance of compound semiconductor devices with the bombardment of high energy particles, the diamond coating process of the present invention does not affect the performance of compound semiconductor devices.

The diamond-like layer obtained using the argon-hydrogen gas mixture in the carbon sputtering process of this invention was significantly improved over that obtained using only argon gas. Specifically, with only argon gas, on an arbitrary scale the resistivity of the diamond-like layer was 3–4 megohms per unit. In the preferred embodiment, the resistivity was greater than 300 megohms per unit, using the same scale. Further, the clarity of the diamond-like layer generated using the argon-hydrogen gas mixture was significantly improved over the clarity of the diamond-like film generated using only argon. The clarity was determined by a subjective comparison of the two diamond films on similar substrates. The clarity of the diamond coating is significant for applications which utilize the light emitting properties of a semiconductor or where in general the passage of light through the diamond layer is required.

In addition, the index of refraction, as measured by well known ellipsometry principles, is improved when hydrogen gas is added to the atmosphere of the sputtering process. Specifically, the index of refraction of the layer generated using the argon-hydrogen gas mixture in the sputtering process was approximately 1.7, while the index of refraction of the film using the pure argon gas was not measurable due to the content of the amorphous carbon.

In another embodiment of the sputtering process, the argon gas was replaced with a mixture of 40% argon and 60% helium gas. For this argon and helium mixture, the pressure for the argon was approximately 8.5 millitorr and the pressure for the helium was approximately 20 millitorr. These pressures were measured at the same location and with the same gauge as described above. As previously stated, the operation of the sputter gun depends upon the target material, the gas used, the voltage and current. When the helium-argon gas mixture described above was used, with 60% helium and 40% argon, with a carbon target, with a DC voltage necessary to produce a DC current of 0.6 amps in conjunction with the above pressures, a deposition rate of about 75 Å per minute was produced. The spacing between the substrate and anode was the same as with the argon/hydrogen mixture. The diamond-like layer obtained using the argon-helium mixture for the sputtering process showed a noticeable improvement over the diamond-like layer obtained when using pure argon. In an implementation employing a helium-argon mixture, the resistivity of the diamond-like layer was 60 megohms per unit, while as described above, the resistivity of the diamond-like layer for the argon gas only was 3–4 megohms per unit, where again the resistivity is measured using the same scale.

In each of the described embodiments, the sputtering process represents a significant enhancement of the prior art methods for forming diamond layers on semiconductor substrates because the absence of high energy ionized particles permits forming diamond-like layers on compound semiconductors without degrading the performance of the semiconductor. Further, since in the method described above the substance being coated is subjected to neither excessively high temperatures nor bombardment by high energy particles, the process is suitable for a wide variety of applications in which the substance being coated would otherwise be destroyed using prior art methods.

Figure 5:
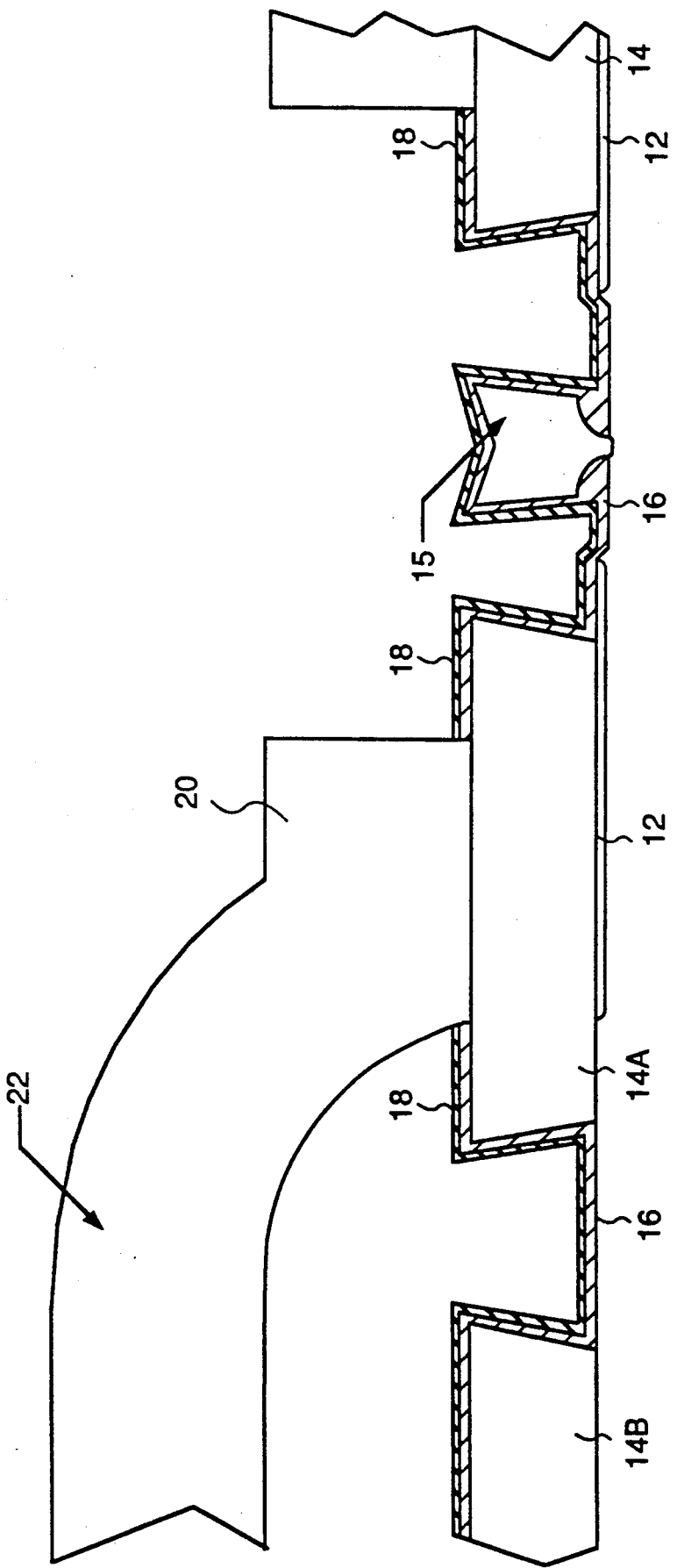
FIG. 5 is a representational view of a semiconductor device, partly cut-away, that incorporates the passivation coating of this invention.

With reference to FIG. 5, a semiconductor device includes a substrate 10 which may be made of gallium arsenide or silicon by way of example. During the manufacture of the semiconductor device, an ohmic contact layer 12 is deposited on substrate 10, followed by the deposition of a metallization layer 14 and the formation of a gate electrode 15. Metallization layer 14 and gate electrode 15 may be formed of gold or another conductive metal, as is well known in the art. Substrate 10 is then positioned in a vacuum chamber fitted with a Sloan Model S-310 sputter gun.

After the residual oxygen and water are removed from the chamber as described above, the chamber is filled with argon under the parameters described above in the first example and a DC plasma current of about 0.2 amps is applied giving a deposition rate onto the wafer is about 50 Å/min. The sputtering deposition serves to deposit one atom at a time on the surface of the wafer so that a thin film of carbon, having a thickness in the range of approximately 100–20,000 Å, and preferably of about 300 Å for GaAs microwave devices, is deposited on the exposed surface portions of the wafer facing cathode 252. The layer of deposited carbon 16, illustrated in FIG. 5, is much harder than graphite and has diamond-like carbon characteristics. Carbon layer 16 adheres well to the exposed areas of substrate 10 and to metallization 14 which is deposited on substrate 10.

In one embodiment, a thin film of almost pure amorphous silicon 18 is deposited on carbon layer 16 by plasma enhanced chemical vapor deposition. The silicon deposition is accomplished at room temperature, using silane gas at a low pressure, which may be about 10 microns or less of mercury, by way of example. R.F. power excitation is applied so that a thin film of about 200–300 Å of silicon is deposited over carbon layer 16. Silicon layer 18 conforms to the underlying carbon layer 16 and effectively seals pin holes and protects the thin carbon layer 16 from damage during further processing. Additionally, silicon film 18 further protects the substrate surface from degrading effects. Other suitable materials in addition to silicon would be, for example, germanium, silicon carbide, silicon dioxide and silicon nitride.

After the deposition of the silicon layer 18, the semiconductor device is then processed to provide a third metallization layer 20 of gold that makes contact with the metallization layer 14 below the passivation material (carbon layer 16) through holes produced by applying photoresist, exposing, developing and dry etching with a fluorine containing plasma. The semiconductor structure is thus provided with conductive lines and bonding pads to enable electrical connection to external circuitry, in a well known manner.

In another implementation, the semiconductor device is fabricated with an air bridge 22, which may be made of gold, that leads from an electrode 14A to the electrode of an adjacent device structure (not shown). Air bridge 22, in effect, skips over the conductor 14B to make connection to the adjacent device. If pressure is inadvertently applied to air bridge 22 so that it is displaced towards the substrate surface, there is a chance that air bridge 22 will contact metallic conductor 14B that normally is separated by air from air bridge 22. By providing a passivation layer made of diamond-like carbon layer 16, or diamond-like carbon layer 16 in combination with a silicon thin film 18, between air bridge 22 and opposing conductor 14B, the electrical shorting condition that would otherwise occur upon contact between air bridge 22 and skipped-over conductor 14B is prevented.

In an alternative implementation, the passivation coating is formed in two parts, the first of which is a sputtered carbon material which is followed by the second part which is harder, diamond-like carbon material, which is deposited by plasma enhanced chemical vapor deposition over the first part. A silicon thin film can be deposited over the second layer of carbon to provide additional protection to the underlying structure.

It should be understood that the invention is not limited to the specific arrangements and parameters set forth above. For example, the passivation material may be amorphous carbon, diamond-like carbon, polycrystalline diamond and/or monocrystalline diamond. The passivation material may be deposited over a third metallization layer of the semiconductor device. The semiconductor device may be bipolar as well as a field effect transistor, optical devices or optoelectronic devices. The magnitudes of the current, temperature, pressure, the working distance between the target and wafer, and the chemical makeup of the gas may be varied within the scope of this invention. Also, methods other than sputter deposition or plasma enhanced chemical vapor deposition may be employed to create the carbon or silicon layers.

The passivation structure affords a very thin film that increases interelectrode capacitances very little and lends itself to enhanced integrated circuit performance. This is in contrast to the thick passivation layers used in prior art devices that tend to degrade performance significantly, as much as 0.5-1 dB in high-frequency gain, for instance. Also, even though the passivation coating is relatively thin, it still provides sufficient protection against chemical penetration. The semiconductive passivation material having diamond-like carbon characteristics dissipates charge build-up very quickly so that drift problems are minimized. The diamond-like carbon, being itself a semiconductor, can form a heterojunction with the semiconductor surface and thereby partially passivate the surface states.

What is claimed is:

1. An assembly comprising:
   a support on which a number of electrically conductive elements are formed; and
   passivation material consisting essentially of one of diamond-like carbon, polycrystalline diamond, and monocrystalline diamond disposed on portions of the surface of said support and said conductive elements.

2. An assembly as in claim 1, including a thin film disposed on said passivation material wherein said thin film consists essentially of silicon.

3. An assembly as in claim 2, wherein the thickness of said silicon film is in the range of about 200–300 Å.

4. An assembly as in claim 1, wherein the thickness of said passivation material is in the range of 100–2000 Å.

5. An assembly as in claim 1, wherein said passivation material consists essentially of diamond-like carbon that is formed from a graphite material by sputter deposition.

6. An assembly as in claim 1, wherein said support comprises a semiconductive material that acts as a substrate for a semiconductor device.

7. An assembly as in claim 6, including metallization layers formed above a surface of said substrate to provide electrical connections and circuitry.

8. An assembly as in claim 7, including an air bridge comprising a metal connection that is connected to a metal conductor formed with said semiconductor device, such that said metal connection overlies but does not contact another metal conductor.

9. A structure comprising:
   a support on which a number of electrically conductive elements are formed;
   passivation material consisting essentially of one of, diamond-like carbon, polycrystalline diamond, and monocrystalline diamond covering portions oft he surface of said support and said conductive elements; and
   a thin film consisting essentially of silicon disposed on said passivation material.

10. An assembly as in claim 5 wherein the diamond-like carbon is formed by sputter deposition in an argon-hydrogen gas mixture.

11. An assembly as in claim 5 wherein the diamond-like carbon is formed by sputter deposition in an argon-helium gas mixture.

12. An assembly as in claim 5 wherein the diamond-like carbon is formed by sputter deposition in argon.

13. A structure as in claim 9, wherein said passivation material consists essentially of diamond-like carbon that is formed from a graphite material by sputter deposition.

14. A structure as in claim 13 wherein the diamond-like carbon is formed by sputter deposition in an argon-hydrogen gas mixture.

15. A structure as in claim 13 wherein the diamond-like carbon is formed by sputter deposition in an argon-helium gas mixture.

16. A structure as in claim 13 wherein the diamond-like carbon is formed by sputter deposition in argon.

17. A semiconductor structure including:
    gallium arsenide field-effect transistor; and
    a diamond-like carbon passivation layer coating said field-effect transistor.

18. A semiconductor structure as in claim 17 wherein the diamond-like carbon layer is formed by sputter deposition in an argon-hydrogen gas mixture.

19. A semiconductor structure as in claim 17 wherein the diamond-like carbon layer is formed by sputter deposition in an argon-helium gas mixture.

20. A semiconductor structure as in claim 17 wherein said diamond-like carbon layer has a thickness of about 150 Angstroms.

21. A semiconductor structure as in claim 17 wherein the diamond-like carbon layer is formed by sputter deposition in argon.

* * * * *